(12) United States Patent
Ye

(10) Patent No.: US 10,863,283 B2
(45) Date of Patent: Dec. 8, 2020

(54) MEMS MICROPHONE FOR FRAME-FREE DEVICE

(71) Applicants: ZILLTEK TECHNOLOGY (SHANGHAI) CORP., Shanghai (CN); ZILLTEK TECHNOLOGY CORP., Hsinchu (CN)

(72) Inventor: Jinghua Ye, Shanghai (CN)

(73) Assignee: ZILLTEK TECHNOLOGY (SHANGHAI) CORP., Shanghai (CN)

( * ) Notice: Subject to any disclaimer, the term of this patent is extended or adjusted under 35 U.S.C. 154(b) by 0 days.

(21) Appl. No.: 16/509,768

(22) Filed: Jul. 12, 2019

(65) Prior Publication Data

US 2020/0178002 A1 Jun. 4, 2020

(30) Foreign Application Priority Data

Dec. 3, 2018 (CN) .......................... 2018 1 1467402

(51) Int. Cl.
*H04R 19/04* (2006.01)
*H04R 19/00* (2006.01)
*B81B 7/00* (2006.01)

(52) U.S. Cl.
CPC ............. *H04R 19/04* (2013.01); *B81B 7/008* (2013.01); *B81B 7/0061* (2013.01); *H04R 19/005* (2013.01); *B81B 2201/0257* (2013.01); *H04R 2201/003* (2013.01)

(58) Field of Classification Search
CPC .... H04R 19/04; H04R 19/005; B81B 7/0061; B81B 7/008
See application file for complete search history.

(56) References Cited

U.S. PATENT DOCUMENTS

| | | | |
|---|---|---|---|
| 2010/0284553 A1* | 11/2010 | Conti ................... | H04R 19/005 381/174 |
| 2010/0308450 A1* | 12/2010 | Verjus ..................... | H01L 24/13 257/690 |
| 2012/0087521 A1* | 4/2012 | Delaus ................. | H04R 19/005 381/174 |

* cited by examiner

*Primary Examiner* — Sunita Joshi
(74) *Attorney, Agent, or Firm* — Andrew F. Young, Esq.; Nolte Lackenbach Siegel

(57) ABSTRACT

A MEMS microphone for a frame-free device, comprising a substrate, wherein the substrate comprises a first substrate region provided with an acoustic sensor, an ASIC chip, and a MEMS chip, and a second substrate region provided with a plurality of pads; both the first substrate region and the second substrate region are disposed at the same side of the substrate; an acoustic through-hole is disposed at the back of the first substrate region; a microphone connection structure further comprises a flexible circuit board, wherein the flexible circuit board electrically connects the plurality of pads of the MEMS microphone to a circuit board of the frame-free device; the acoustic through-hole is aligned with an acoustic opening of the frame-free device; by adopting the MEMS microphone for a frame-free device, the MEMS microphone may be more widely used in many high-tech industries and has better acoustic performance over the conventional MEMS microphone.

12 Claims, 3 Drawing Sheets

MEMS MICROPHONE FOR FRAME-FREE DEVICE

CROSS-REFERENCE TO RELATED APPLICATIONS

The present application claims priority to and the benefit of Chinese Patent Application No. 201811467402.7, filed on Dec. 13, 2018, the entire content of which is incorporated herein by reference.

FIGURE SELECTED FOR PUBLICATION

FIG. 1.

BACKGROUND OF THE INVENTION

1. Field of the Invention

The invention relates to the field of microphones, and more particularly, to a MEMS (Micro-Electro-Mechanical Systems) microphone for a frame-free device.

2. Description of the Related Art

Since the MEMS microphone has many advantages of small size, good heat resistance and is easy to be integrated, it is widely used in many applications. A conventional MEMS microphone has a package structure comprised of a MEMS chip and an ASIC chip, which are disposed in a cavity formed by a circuit board and a shell. And the cavity is in communication with external space through sound holes. Notably, one skilled in the art classifies the MEMS microphone structure into two types of MEMS microphone according to the position of the sound bores, namely, a top-port MEMS microphone and a bottom-port MEMS microphone. Specifically, sound bores for the top-port MEMS microphone are disposed on the shell, while sound bores for the bottom-port MEMS microphone are disposed on the circuit board. For the same chip, the bottom-port MEMS microphone provides a better acoustic performance. In addition, the top-port MEMS microphone package structure and the method for manufacturing the same have some defects, such as high costs, complicated steps and difficult process.

SUMMARY OF THE INVENTION

Aiming at the forgoing problems and limitations in the existing MEMS microphone, the present invention provides a bottom-port MEMS microphone for a frame-free device, having a simple structure and an improved acoustic performance.

Detailed technical solutions are as follows:

A MEMS microphone for a frame-free device, comprising a substrate, wherein the substrate comprises a first substrate region provided with an acoustic sensor, and a second substrate region provided with a plurality of pads, wherein the plurality of pads are uniformly distributed in the second substrate region; both the first substrate region and the second substrate region are disposed at the same side of the substrate; an acoustic through-hole is disposed in the first substrate region.

Preferably, an ASIC (Application Specific Integrated Circuit) chip and a MEMS chip are further disposed in the first substrate region, and a metal cover covers the acoustic sensor, the ASIC chip and the MEMS chip.

Preferably, a dustproof stratum reticulare, covering the acoustic through-hole, is arranged at the back of the first substrate region.

Preferably, the substrate takes the form of an elongated strip.

A microphone connection structure for a frame-free device further comprises a flexible circuit board, wherein the flexible circuit board connects the plurality of pads of the MEMS microphone to a circuit board of the frame-free device, Preferably, the acoustic through-hole is aligned with an acoustic opening of the frame-free device.

Preferably, the MEMS microphone further comprises a support member which fixes the MEMS microphone to the frame-free device.

Preferably, the MEMS microphone is a bottom-port microphone.

Preferably, the dustproof stratum reticulare is made of a silicon-based material.

Preferably, the MEMS microphone is used for the frame-free device.

The above-mentioned technical solutions have the following advantageous effects:

1. by adopting the MEMS microphone for a frame-free device, the MEMS microphone may be more widely used in many high-tech industries, such as smart phones and cameras;

2. the MEMS microphone according to the present invention has better acoustic performance over the conventional MEMS microphone.

BRIEF DESCRIPTION OF THE DRAWINGS

The accompanying drawings, together with the specification, illustrate exemplary embodiments of the present disclosure, and, together with the description, serve to explain the principles of the present invention.

Figure 1:
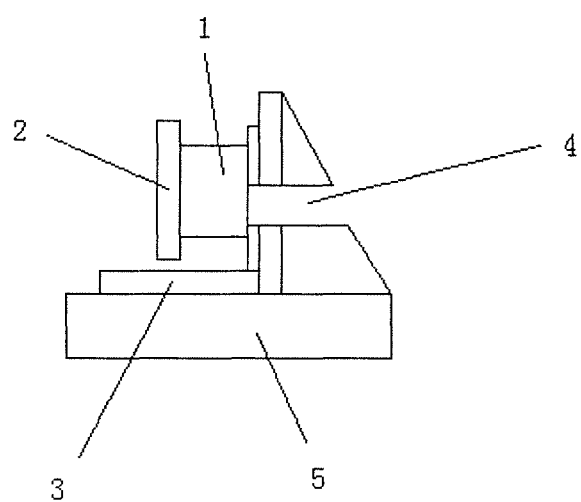
FIG. 1 is a schematic view showing an overall structure of a MEMS microphone for a frame-free device according to the present invention.
Figure 2:
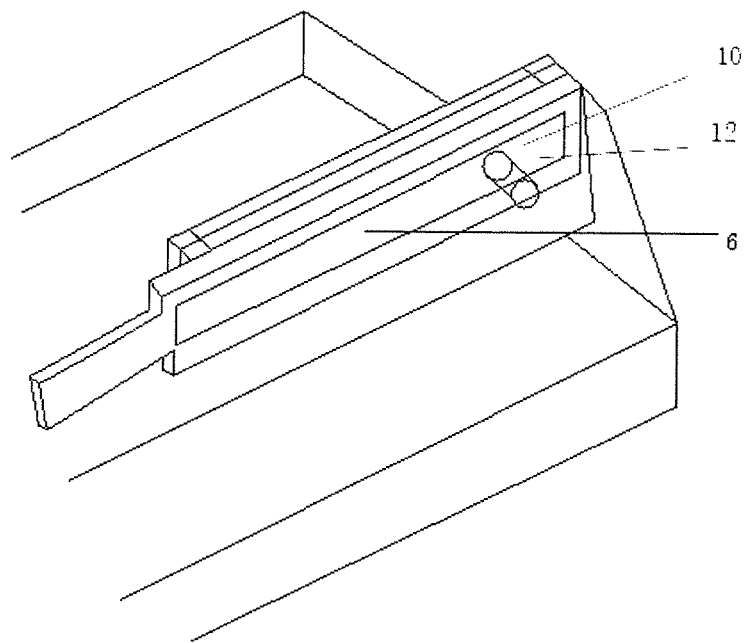
FIG. 2 is a schematic view of a MEMS microphone for a frame-free device according to the present invention.
Figure 3:
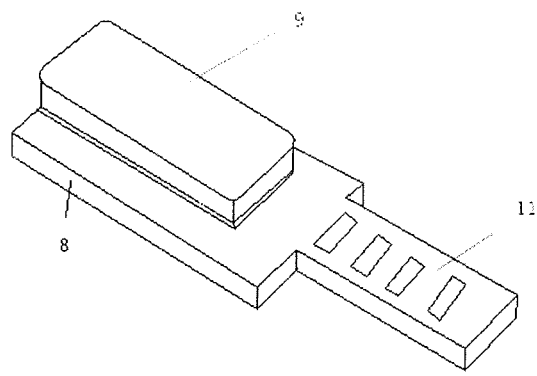
FIG. 3 is a top view of a MEMS microphone for a frame-free device according to the present invention.
Figure 4:
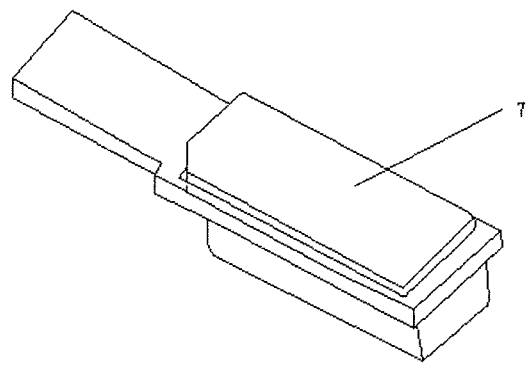
FIG. 4 is a bottom view of a MEMS microphone for a frame-free device according to the present invention.

In the accompanied drawings: 1. MEMS microphone; 2. support member; 3. flexible circuit board; 4. acoustic through-hole; 5. frame-free device; 6. ASIC chip; 7. first substrate region; 8. dustproof stratum reticulare; 9. metal cover; 10. acoustic sensor; 11. second substrate region; 12. MEMS chip

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

As shown in the figures, a MEMS microphone for a frame-free device, comprising a substrate, wherein the substrate comprises a first substrate region 7 provided with an acoustic sensor 10, and a second substrate region 11 provided with a plurality of pads, wherein the plurality of pads are uniformly distributed in the second substrate region; both the first substrate region 7 and the second substrate region 11 are disposed at the same side of the substrate; an acoustic through-hole 4 is disposed in the first substrate region 7.

In a preferred embodiment of the present invention, an ASIC (Application Specific Integrated Circuit) chip 6 and a MEMS chip 12 are further disposed in the first substrate region 7, and a metal cover 9 covers the acoustic sensor 10, the ASIC chip 6 and the MEMS chip 12.

In a preferred embodiment of the present invention, a dustproof stratum reticulare 8 is arranged in the first substrate region 7, and the dustproof stratum reticulare 8 covers the acoustic through-hole 4, allowing sound to transmit into the device.

In a preferred embodiment of the present invention, the substrate takes the form of an elongated strip.

A microphone connection structure for a frame-free device further comprises a flexible circuit board 3, wherein the flexible circuit board 3 connects the plurality of pads of the MEMS microphone 1 to a circuit board of the frame-free device 5.

In a preferred embodiment of the present invention, the acoustic through-hole 4 is aligned with an acoustic opening of the frame-free device 5.

In a preferred embodiment of the present invention, the MEMS microphone 1 further comprises a support member 2 which fixes to the MEMS microphone 1 to the frame-free device 5.

In a preferred embodiment of the present invention, the MEMS microphone is a bottom-port microphone, and compared with the traditional top-port microphone, the latter has a better acoustic performance.

In a preferred embodiment of the present invention, the dustproof stratum reticulare 8 is made of a silicon-based material, which is waterproof and resistant to high temperature.

In a preferred embodiment of the present invention, the MEMS microphone is used for a frame-free device.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A MEMS microphone for a frame-free device, comprising:
    a substrate, wherein the substrate comprises a first substrate region provided with an acoustic sensor, and a second substrate region provided with a plurality of pads, wherein the plurality of pads are uniformly distributed in the second substrate region; both the first substrate region and the second substrate region are disposed at the same side of the substrate; an acoustic through-hole is disposed in the first substrate region; an ASIC (Application Specific Integrated Circuit) chip is further disposed in the first substrate region, and a metal cover covers the acoustic sensor and the ASIC chip; the plurality of pads are configured to connect a circuit board of the frame-free device; the metal cover and the plurality of pads are disposed at the same surface of the substrate;
    a dustproof stratum reticulare, covering the acoustic through-hole, is arranged at the back of the first substrate region.

2. The MEMS microphone as claimed in claim 1, wherein the substrate takes the form of an elongated strip.

3. A microphone connection structure for a frame-free device, comprising the MEMS microphone according to claim 1, further comprising:
    a flexible circuit board, wherein the flexible circuit board connects the plurality of pads of the MEMS microphone to a circuit board of the frame-free device, and the acoustic through-hole is aligned with an acoustic opening of the frame-free device.

4. A microphone connection structure for a frame-free device, comprising the MEMS microphone according to claim 2, further comprising:
    a flexible circuit board, wherein the flexible circuit board connects the plurality of pads of the MEMS microphone to a circuit board of the frame-free device, the acoustic through-hole is aligned with an acoustic opening of the frame-free device.

5. The microphone connection structure as claimed in claim 3, further comprising:
    a support member which fixes the MEMS microphone to the frame-free device.

6. The microphone connection structure as claimed in claim 4, further comprising:
    a support member which fixes the MEMS microphone to the frame-free device.

7. The microphone connection structure as claimed in claim 3, wherein:
    the MEMS microphone is a bottom-port microphone.

8. The microphone connection structure as claimed in claim 4, wherein:
    the MEMS microphone is a bottom-port microphone.

9. The microphone connection structure as claimed in claim 3, wherein:
    the dustproof stratum reticulare is made of a silicon-based material.

10. The microphone connection structure as claimed in claim 4, wherein:

the dustproof stratum reticulare is made of a silicon-based material.

11. The microphone connection structure as claimed in claim 3, wherein:
the MEMS microphone is used for the frame-free device.

12. The microphone connection structure as claimed in claim 4, wherein:
the MEMS microphone is used for the frame-free device.

* * * * *